US006943875B2

United States Patent
DeFelice et al.

(12) United States Patent
DeFelice et al.

(10) Patent No.: US 6,943,875 B2
(45) Date of Patent: Sep. 13, 2005

(54) TESTING THE FRONTSIDE EMISSION OF BOTTOM-EMITTING VCSELS

(75) Inventors: Richard Alden DeFelice, Bernardsville, NJ (US); Ashok V. Krishnamoorthy, Lawrenceville, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 10/864,972

(22) Filed: Jun. 10, 2004

(65) Prior Publication Data

US 2004/0233451 A1 Nov. 25, 2004

Related U.S. Application Data

(62) Division of application No. 09/885,818, filed on Jun. 20, 2001, now Pat. No. 6,836,321.

(51) Int. Cl.[7] .............................................. G01N 21/88
(52) U.S. Cl. ...................................... 356/237.1; 372/96
(58) Field of Search ......................... 356/237.1; 372/96

(56) References Cited

U.S. PATENT DOCUMENTS

| | | | | |
|---|---|---|---|---|
| 6,160,834 A | * | 12/2000 | Scott ............................ | 372/96 |
| 6,560,262 B1 | * | 5/2003 | Alam et al. .................... | 372/96 |
| 6,829,262 B1 | * | 12/2004 | Ackerman et al. ............. | 372/96 |
| 6,836,321 B2 | * | 12/2004 | DeFelice et al. ........... | 356/237.1 |

* cited by examiner

Primary Examiner—Richard A. Rosenberger

(57) ABSTRACT

An array of bottom-emitting VCSELs, with its substrate still intact, is tested by means of a probe that includes an optoelectronic array, which is aligned and coupled to the top surface of the VCSEL array. The probe is aligned to the VCSEL array just once. The optoelectronic array includes driver circuits for energizing the VCSELs and the photodetection circuits in a predetermined sequence for detecting the back emission that leaks through the top mirror of each VCSEL. In another embodiment, this probe and method are applied to testing bottom-emitting VCSELs one at a time. The VCSELs may discrete devices or part of an array. In accordance with another aspect of our invention, an array of bottom-emitting VCSELs, with its substrate still in intact, is tested by means of a probe that includes separate electronic and photodetection arrays. The probe is aligned to the VCSEL array just once. The electronic array, which is electrically coupled to the top surface of the VCSEL array, includes driver circuits for energizing the VCSELs. The photodetection array is aligned and coupled to the bottom of the substrate in order to detect the primary bottom emission of the energized VCSELs. The photodetection array is aligned so that each detector receives the emission from a particular VCSEL, but because the substrate is relatively thick, the divergence of the bottom emission produces cross-talk; that is, the bottom emission of one VCSEL may be received by an adjacent photodetector that is supposed to detect only the emission from another VCSEL. To alleviate this cross-talk problem, the VCSELs are energized in a first predetermined sequence and/or the photodetector circuitry is turned on in a second predetermined sequence.

16 Claims, 2 Drawing Sheets

TESTING THE FRONTSIDE EMISSION OF BOTTOM-EMITTING VCSELS

This is a Division of application Ser. No. 09/885,818, filed Jun. 20, 2001, now U.S. Pat. No. 6,836,321.

FIELD OF THE INVENTION

This invention relates generally to vertical cavity surface-emitting lasers (VCSELs) and, more particularly, to methods of testing bottom-emitting VCSELs.

BACKGROUND OF THE INVENTION

A VCSEL is a semiconductor laser in which a first multiplicity of semiconductor layers (e.g., Group III–V compound layers) forms an active region (e.g., an MQW active region), which is sandwiched between a second and third multiplicity of layers, which form a pair of mirrors. One mirror, the bottom mirror, is formed under the active region and nearer the substrate, whereas the other mirror, the top mirror, is formed above the active region and farther from the substrate. The mirrors define a cavity resonator having its longitudinal axis oriented perpendicular to the plane of the layers. When the active region is forward biased and pumping current is applied thereto in excess of the lasing threshold, the VCSEL generates stimulated, coherent radiation that is emitted along the resonator axis. The wavelength of the radiation is determined by the bandgap of the material used to form the active region. Thus, for operation at relatively short wavelengths in the range of about 800–1000 nm, the layers of the active region typically comprise GaAs/AlGaAs compounds epitaxially grown on an optically absorbing GaAs substrate, whereas for operation at longer wavelengths of about 1100–1600 nm, the layers typically comprise InP/InGaAsP compounds epitaxially grown on an optically transparent InP substrate.

The radiation may emerge through either or both mirrors depending on their reflectivity. A VCSEL is termed a bottom-emitting device if the primary, relatively high intensity, emission is through the bottom mirror. This emission will propagate through the substrate if it is optically transparent. In many designs the substrate is removed and hence, even if it had been optically absorbing, does not obstruct the emission through the bottom mirror. On the other hand, the secondary, much lower intensity, emission that leaks through the top mirror is termed the backside emission. Bottom-emitting VCSELs are attractive because they are known to facilitate flip-chip bonding. In contrast, a VCSEL is termed a top-emitting device if the primary emission is through the top mirror.

One important feature of VCSELs is their ability to be fabricated in an array containing, for example, thousands of lasers. These arrays can be used to provide a multiplicity of carrier sources in fiber optic communication systems; e.g., dense optical interconnect solutions for high-end routers, cross-connects and switching systems. Before an array can be employed in a communications application, or any other application for that matter, it must be tested in order to determine whether each VCSEL, as well as the overall array, satisfies predetermined performance specifications. Defective VCSELs (i.e., those that do not meet specification) result in lower efficiency and wasted power consumption. Optimally an array is tested at a time in the manufacturing process (e.g., before substrate removal or final assembly) that minimizes economic loss should the array fail to meet specification and have to be discarded. To this end in the prior art, a top-emitting VCSEL array is probed in step-and-repeat fashion, one VCSEL at a time—a very time consuming, expensive process. The probe includes driver circuitry for supplying the necessary bias voltage and pumping current to the VCSEL under test and photodetection circuitry for measuring the intensity of the primary emission. Testing bottom-emitting VCSEL arrays is more problematic. For short wavelength bottom-emitting devices, the presence of the absorbing substrate prevents making optical measurements of the primary emission. To our knowledge, therefore, manufacturers limit their testing of short wavelength, bottom-emitting VCSELs to making electrical measurements to identify shorts or open circuits in each VCSEL, again using a step-and-repeat approach. In contrast, the substrate of long wavelength bottom-emitting VCSELs is transparent, but these devices are not currently in commercial manufacture to our knowledge.

Thus, a need remains in the art for an effective technique for testing bottom-emitting VCSELs regardless of their wavelength of operation.

SUMMARY OF THE INVENTION

In accordance with one aspect of our invention, an array of bottom-emitting VCSELs, with its substrate still intact, is tested by means of a probe that includes an optoelectronic array, which is aligned and coupled to the top surface of the VCSEL array. The probe is aligned to the VCSEL array just once. The optoelectronic array includes driver circuits for energizing the VCSELs and the photodetection circuits in a predetermined sequence for detecting the back emission that leaks through the top mirror of each VCSEL. In another embodiment, this probe and method are applied to testing bottom-emitting VCSELs one at a time. The VCSELs may be discrete devices or part of an array.

In accordance with another aspect of our invention, an array of bottom-emitting VCSELs, with its substrate still in intact, is tested by means of a probe that includes separate electronic and photodetection arrays. The probe is aligned to the VCSEL array just once. The electronic array, which is electrically coupled to the top surface of the VCSEL array, includes driver circuits for energizing the VCSELs. The photodetection array is aligned and coupled to the bottom of the substrate in order to detect the primary bottom emission of the energized VCSELs. The photodetection array is aligned so that each detector receives the emission from a particular VCSEL, but because the substrate is relatively thick, the divergence of the bottom emission produces cross-talk; that is, the bottom emission of one VCSEL may be received by an adjacent photodetector that is supposed to detect only the emission from another VCSEL. To alleviate this cross-talk problem, the VCSELs are energized in a first predetermined sequence and/or the photodetector circuitry is turned on in a second predetermined sequence; e.g., so that all VCSELs are on concurrently and adjacent photodetectors are not on at the same time. Alternatively, all of the photodetection circuitry may be turned on concurrently, and the VCSELs may be energized in a predetermined sequence to reduce cross-talk. In another example, first groups (e.g., pairs) of VCSELs may be energized in a first predetermined sequence and second groups (e.g., pairs) of photodetection circuits may be energized in a second predetermined sequence so as to reduce cross-talk, with VCSELs in each first group being energized concurrently with one another and circuits in each second group being energized concurrently with one another.

Both aspects of our invention enable testing of an entire array essentially simultaneously, thereby reducing costs of testing to the point that it is feasible to test all VCSEL arrays prior to final assembly. Since only VCSEL arrays that meet specification are assembled, final device yields are improved. Furthermore, and in accordance with another embodiment of our invention, the drive circuits to the VCSELs that do not meet specification are turned off in the final device, thereby reducing power consumption wasted on such VCSELs.

BRIEF DESCRIPTION OF THE DRAWING

Our invention, together with its various features and advantages, can be readily understood from the following more detailed description taken in conjunction with the accompanying drawing, in which.

In the interest of clarity and simplicity, the figures have not been drawn to scale.

DETAILED DESCRIPTION OF THE INVENTION

Preferred Embodiment

Figure 1:
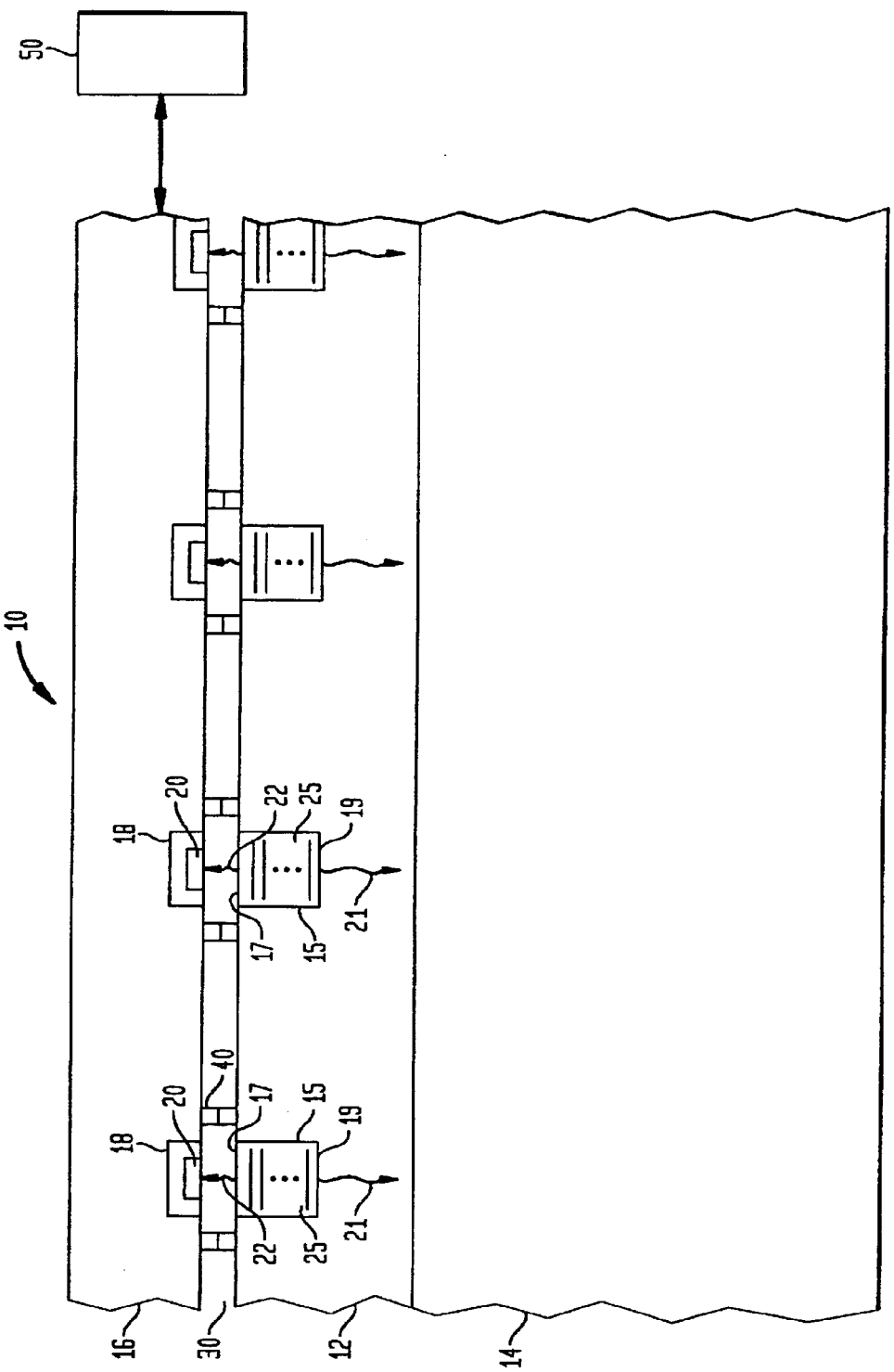
FIG. 1 is a schematic view of apparatus for testing an array of bottom-emitting VCSELs in accordance with one aspect of our invention.

With reference now to FIG. 1, apparatus 10 for testing VCSELs includes an array 12 of bottom-emitting VCSELs 15 formed on a substrate 14. The array 12 is depicted at an intermediate stage of its manufacture; i.e., before the substrate has been removed and before final assembly. Each VCSEL comprises an active region 25 sandwiched between a backside reflector 17 and frontside reflector 19. The two reflectors form an optical cavity resonator that has its longitudinal axis essentially perpendicular to the plane of the VCSEL layers. A probe in the form of an optoelectronic array 16 is aligned with and coupled to the VCSEL array 12 just once. The coupling is both electrical and optical. Thus, the array 16 includes driver circuits 18 for applying forward bias voltage and pumping current to the VCSELs in a predetermined sequence. The current is sufficient to cause the selected VCSELs to emit radiation, which below threshold is spontaneous emission and above threshold is stimulated emission. The emission has two principal parts: primary emission 21 that emerges from relatively low reflectivity, frontside reflector 19 and secondary, lower power, emission 22 that leaks through relatively higher reflectivity, backside mirror 17. The optoelectronic array 16 also includes photodetection circuitry 20, which typically includes suitable photodetectors (not shown) aligned to receive the backside emissions 22 of the VCSELs. The photodetector circuitry is likewise turned on in a predetermined sequence. For example, all of the VCSELs and all of the photodetection circuitry may be turned concurrently. Other sequences, however, may be advantageous as discussed infra with respect to the embodiment of FIG. 2.

Electrical contacts 30 on the VCSEL array 12 and electrical contacts 40 on the optoelectronic array 16 enable the drive circuitry 18 to deliver the requisite voltage and current to the VCSEL array. In addition, the contacts are shaped (e.g., as annular rings) to provide an unimpeded path for the weak backside emission 22 to be received by the photodetectors in the photodetection circuitry 20.

Collection of data from the various tests requires only a single act of aligning the probe to the VCSEL array. The data is illustratively delivered to a computer 50, which calculates the various performance parameters of the VCSELs (e.g., the threshold current, slope efficiency, impedance, optical, power, which are derived from measured L-I and I-V curves) and compares them to predetermined specifications. The computer may map the array to identify good VCSELs and defective VCSELs. Later, if the overall VCSEL array meets specification and is finally assembled, this map may be used to provide control signals to the drive circuitry used to actually operate the VCSEL array; i.e., in order to turn on good VCSELs and to turn off defective VCSELs, thereby reducing power consumption that would otherwise be wasted on improperly functioning or non-functioning VCSELs.

In accordance with another embodiment of our invention, the foregoing testing method may be applied to VCSELs one at a time; that is, single, discrete VCSELs or single VCSELs in an array. One-at-a-time testing may be done in well-known step-and-repeat fashion. Thus, at an intermediate stage of its manufacture, a bottom-emitting VCSEL is tested by measuring the backside emission that leaks through the backside reflector, determining whether a selected quality of the VCSEL meets predetermined specification, and then finishing the VCSEL assembly in a configuration that is designed to use radiation emitted from the frontside reflector. In final assembly the substrate is typically removed.

In either case, the VCSELs may be either short wavelength devices such as those made from layers of GaAs/AlGaAs compounds on an optically absorbing GaAs substrate for operation at wavelengths of about 800–1000 nm, or may be longer wavelength devices such as those made from layers of InP/InGaAsP compounds on an optically transparent InP substrate for operation at wavelengths of about 1100–1600 nm. Other Group III–V compounds may also be used.

The optoelectronic array may be fabricated in a Si substrate to include, for example, CMOS driver and photodetection circuitry. Likewise, the photodetectors may be Si p-i-n photodiodes.

Alternative Embodiment

Figure 2:
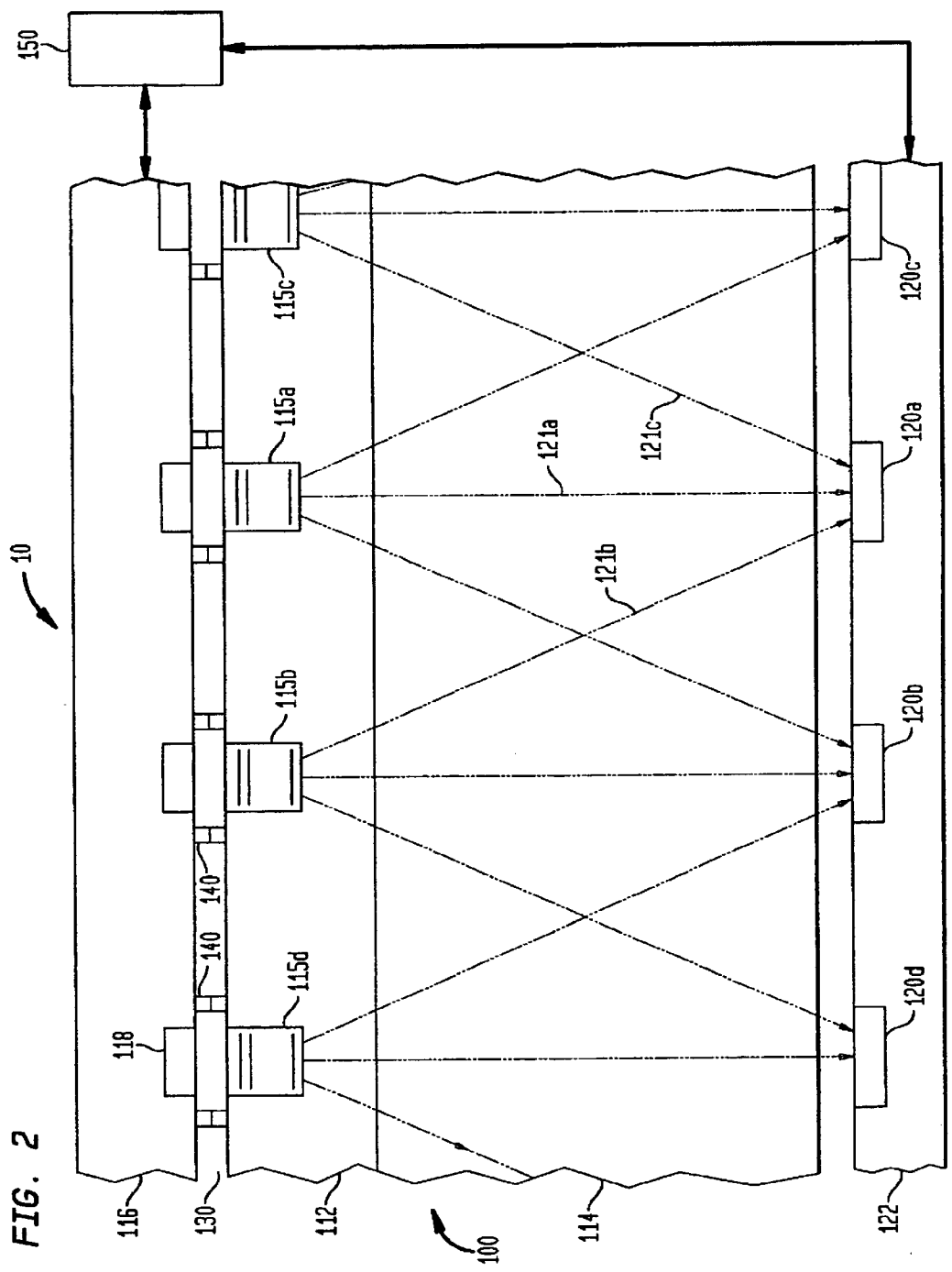
FIG. 2 is a schematic view of alternative apparatus for testing an array of bottom-emitting VCSELs having a transparent substrate in accordance with another aspect of our invention.

In accordance with another aspect of our invention, FIG. 2 shows apparatus 100 for testing an array 112 of bottom-emitting VCSELs 115 formed on a transparent substrate 114. As before, the array 112 is depicted at an intermediate stage of its manufacture. In this case, however, the drive circuitry 118 and the photodetection circuitry 120 are separated from one another. The electronic array 116, which includes the drive circuitry 118, is aligned with the top surface of the VCSEL array and is electrically coupled thereto via contacts 130 and 140 on the VCSEL and electronic arrays, respectively. The photodetection array 122, which includes photodetectors 120 (and associated detection circuits, not shown), is aligned with the VCSEL array 112 so that a particular photodetector (e.g., 120a) is nominally positioned to receive only the primary, frontside emission (e.g., 121a) of its corresponding VCSEL (e.g., 115a). However, because the VCSELs are relatively densely packed, because their output beams tend to diverge (especially over the relatively large thickness of the substrate 114), and further because the photodetectors tend to have relatively broad photosensitive areas, each photodetector (e.g., 120a) may receive unwanted, stray optical radiation (e.g., 121b and 121c) from adjacent or other non-adjacent VCSELs. This stray radiation or cross-talk will, of course, distort the data received by the photodetector in question (e.g., 120a), thereby providing a false measurement of the performance of the VCSEL (e.g., 115a) associated with that photodetector.

In order to alleviate this problem, the computer 150, or other controller, illustratively turns on all of the VCSELs concurrently, but turns on the photodetection circuitry in a predetermined sequence to reduce cross-talk; for example, the sequence may require that when photodetector 120a is being read, all adjacent photodetectors 120b and 120c (as well as those, not shown, in the third dimension) are off. Other sequencing algorithms are also within the scope of our invention.

Alternatively, the computer 150 may turn on all of the photodetection circuitry concurrently, but turn on the VCSELs in a predetermined sequence in order to reduce cross-talk; for example, the sequence may require that when VCSEL 115a is on, all adjacent VCSELs 115b and 115c (as well as those, not shown, in the third dimension) are off. As before, other sequencing algorithms are also within the scope of our invention.

In another example, computer 150 may energize first groups (e.g., pairs) of VCSELs in a first predetermined sequence and second groups (e.g., pairs) of photodetection circuits in a second predetermined sequence so as to reduce cross-talk, with VCSELs in each first group being energized concurrently with one another and circuits in each second group being energized concurrently with one another.

This aspect of our invention is particularly useful for testing VCSELs that have transparent substrates; e.g., long wavelength VCSELs that are formed from InP/InGaAsP compounds on InP substrates. As before, in final assembly the substrate is typically removed.

The electronic array may be fabricated in a Si substrate to include, for example, CMOS drivers. The photodetection array may likewise be fabricated in a Si substrate and may include Si p-i-n photodiodes, or it may be formed as Group III–V compound devices including, for example, InGaAs p-i-n photodiodes.

It is to be understood that the above-described arrangements are merely illustrative of the many possible specific embodiments that can be devised to represent application of the principles of the invention. Numerous and varied other arrangements can be devised in accordance with these principles by those skilled in the art without departing from the spirit and scope of the invention.

What is claimed is:

1. A method of testing a bottom-emitting VCSEL array at an intermediate stage of its manufacture, the VCSEL array including VCSELs each having a cavity resonator formed by a relatively low reflectivity frontside reflector and a relatively higher reflectivity backside reflector, comprising the steps of:
    aligning a probe with said VCSEL array, said probe including a first array of electronic circuits coupled to one side of said VCSEL array and to each of said VCSELs for causing said VCSELs to emit radiation and including a second array of photodetection circuits, including photodetectors coupled to an opposite side of said VCSEL array and to each of said VCSELs for detecting radiation emitted through each of said frontside reflectors,
    without performing another act of aligning said probe, determining from said detected frontside radiation whether a selected quality of each VCSEL meets a predetermined specification, said determining step including energizing said electronic and photodetection circuits in a fashion to reduce cross-talk between VCSELs and each photodetector, and then for those VCSEL arrays that meet specification, finishing their manufacture in a configuration designed to use radiation emitted from said frontside reflectors.

2. The invention of claim 1 wherein said VCSELs are energized in a first predetermined sequence and said photodetection circuitry is energized in a second predetermined sequence so as to reduce cross-talk.

3. The invention of claim 2 wherein all of said VCSELs are energized concurrently, but said photodetection circuits are energized in a sequence that reduces said cross-talk.

4. The invention of claim 3 wherein said photodetection circuits are energized in a sequence that turns on a particular one of said circuits while concurrently turning off circuits adjacent thereto.

5. The invention of claim 2 wherein all of said photodetection circuits are energized concurrently, but said VCSELs are energized in a sequence that reduces said cross-talk.

6. The invention of claim 5 wherein said VCSELs are energized in a sequence that turns on a particular one of said VCSELs while concurrently turning off VCSELs adjacent thereto.

7. The invention of claim 2 wherein first groups of said VCSELs are energized in said first sequence and second groups of said circuitry are energized in said second sequence, with VCSELs in each of said first groups being energized concurrently with one another and circuits in each of said second groups being energized concurrently with one another.

8. The invention of claim 1 wherein said intermediate stage includes fabricating said VCSEL array on a substrate and said aligning and determining steps are performed without removing said substrate.

9. The invention of claim 8 wherein said finishing step includes removing said substrate before final assembly.

10. Apparatus for testing a bottom-emitting VCSEL array at an intermediate stage of its manufacture when its substrate is intact, the VCSEL array including VCSELs each having a cavity resonator formed by a relatively low reflectivity frontside reflector and a relatively higher reflectivity backside reflector, said apparatus comprising:
    a probe including a first array of electronic circuits coupled to one side of said VCSEL array and to each of said VCSELs for causing selected ones of said VCSELs to emit radiation and including a second array of photodetection circuits, including photodetectors coupled to an opposite side of said VCSEL array and to each of said VCSELs for detecting radiation emitted through each of said frontside reflectors,
    means for aligning said probe just once with said VCSEL array, and
    means for determining from said detected frontside radiation whether a selected quality of each VCSEL meets a predetermined specification, said determining means including means for energizing said electronic and photodetection circuits in a fashion to reduce cross-talk between VCSELs and each photodetector.

11. The invention of claim 10 wherein said probe energizes said VCSELs in a first predetermined sequence and said photodetection circuitry in a second predetermined sequence so as to reduce cross-talk.

12. The invention of claim 11 wherein said probe energizes all of said VCSELs concurrently, but energizes said photodetection circuits in a sequence that reduces said cross-talk.

13. The invention of claim 12 wherein said probe energizes said photodetection circuits in a sequence that turns on a particular one of said circuits while essentially simultaneously turning off circuits adjacent thereto.

14. The invention of claim 11 wherein said probe energizes all of said photodetection circuits concurrently but energizes said VCSELs in a sequence that reduces said cross-talk.

15. The invention of claim 14 wherein said probe energizes said VCSELs in a sequence that turns on a particular one of said VCSELs while concurrently turning off VCSELs adjacent thereto.

16. The invention of claim 11 wherein said probe energizes first groups of said VCSELs in said first sequence and second groups of said circuitry in said second sequence, with VCSELs in each of said first groups being energized concurrently with one another and circuits in each of said second groups being energized concurrently with one another.

* * * * *